United States Patent [19]

Janutka

[11] Patent Number: 4,471,245
[45] Date of Patent: Sep. 11, 1984

[54] FET GATING CIRCUIT WITH FAST TURN-ON CAPACITOR

[75] Inventor: William J. Janutka, West Allis, Wis.

[73] Assignee: Eaton Corporation, Cleveland, Ohio

[21] Appl. No.: 390,480

[22] Filed: Jun. 21, 1982

[51] Int. Cl.³ .............. H03K 17/04; H03K 17/12; H03K 17/60; H03K 17/687

[52] U.S. Cl. .................. 307/571; 307/246; 307/270; 307/570; 307/584

[58] Field of Search .......... 307/499, 501, 246, 577, 307/570–575, 581, 584, 270, 297, 318; 330/288

[56] References Cited

U.S. PATENT DOCUMENTS

| 3,614,477 | 10/1971 | Liebman | 307/572 X |
| 3,678,297 | 7/1972 | Takahashi | 307/572 |
| 3,740,581 | 6/1973 | Pfiffner | 307/570 |
| 4,280,069 | 7/1981 | Kompelien | 307/571 |
| 4,316,243 | 2/1982 | Archer | 307/570 X |

Primary Examiner—Stanley D. Miller
Assistant Examiner—David R. Hudspeth
Attorney, Agent, or Firm—M. E. Taken; C. H. Grace

[57] ABSTRACT

A fast turn-on FET circuit is provided by a constant current source and fast turn-on capacitor combination in the gate circuit of the FET. At turn-on, a bypass capacitor momentarily short-circuits a control resistor in the current source such that a momentarily higher current is supplied by the current source to the FET gate until the capacitor is charged, whereafter constant current as controlled by the resistor is supplid to the FET gate circuitry to maintain conduction.

5 Claims, 2 Drawing Figures

FET GATING CIRCUIT WITH FAST TURN-ON CAPACITOR

TECHNICAL FIELD

The invention relates to enhancement mode field effect transistors (FETs), and more particularly to gating circuitry facilitating fast turn-on.

BACKGROUND AND SUMMARY

Field effect transistors are well known in the art, including various gating techniques. An enhancement mode FET conducts current between its drain and source in response to gate voltage. Because of the capacitance that exists between the gate, source and drain of the FET, any change in the gate voltage is achieved only through an attendant movement of charge to and from the FET gate region. The speed with which a FET can be turned on and off is dependent upon the speed with which the charge can be stored in and removed from the gate capacitance. Some gating circuits are able to supply sufficient current to charge the gate rapidly to attain fast turn-on. The present invention relates to this latter type of gating circuit.

The invention provides FET gate drive circuitry including in combination a current source for supplying constant current to maintain requisite FET gate voltage, and a bypass capacitor connected to the control resistance means of the current source for momentarily short-circuiting the latter at turn-on. A momentarily higher current is supplied by the current source to the FET gate until the bypass capacitor is charged, whereafter lower level constant current is supplied.

DETAILED DESCRIPTION

Figure 1:
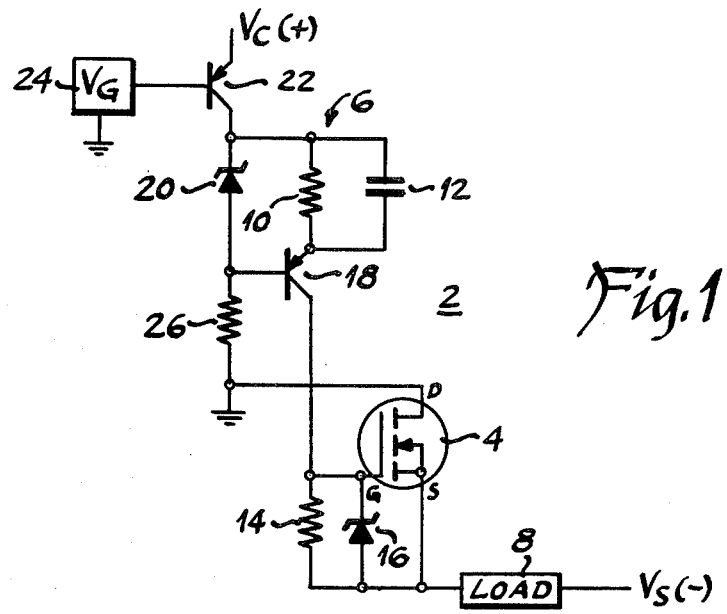
FIG. 1 is a circuit diagram of a fast turn-on FET circuit constructed in accordance with the invention.

In FIG. 1, a fast turn-on FET circuit 2 includes an n channel source follower enhancement mode MOSFET 4 driven into conduction at its gate by current source means 6 to control a load 8 from a voltage supply $V_s$. Current source 6 includes control resistance means 10 for controlling the amount of constant current supplied to resistor 14 to maintain requisite gate voltage for conduction of FET 4. Bypass capacitor means 12 is connected to the control resistance means 10 for momentarily short-circuiting the latter at turn-on such that a momentarily higher current is supplied by current source 6 to the FET gate. The voltage developed across resistor 14 between gate and source drives the FET into conduction, such that current may flow from the grounded FET drain to the FET source and through load 8 to the supply voltage. Zener diode 16 provides gate transient protection.

Current source 6 comprises a PNP bipolar transistor 18 having its base-emitter voltage set by a zener diode 20 supplied from voltage source $V_c$ through bipolar transistor 22 when base driven into conduction by gating voltage source 24. The control resistance 10 is in the emitter circuit of transistor 18, and capacitor 12 is connected in parallel with resistor 10. The base of transistor 18 is grounded through resistor 26.

In operation, without bypass capacitor 12, zener diode 20 sets the base-emitter voltage of transistor 18 which establishes the current from $V_c$ through resistor 10 and transistor 18 at a constant level. This type of current source is known. The addition of capacitor 12 in combination in the FET circuit allows added current to be supplied through transistor 18 to the FET gate to decrease the FET gate voltage rise time to overcome the inherent FET capacitance and afford faster FET turn-on. The increased rate of rise is limited by the gain of transistor 18, its base drive resistor 26 and the inherent FET gate capacitance.

At turn-on, capacitor 12 appears as a short-circuit around control resistor 10, and higher level current is momentarily supplied through transistor 18 to drive the FET gate. This momentary short-circuit higher current is enabled until capacitor 12 is charged, whereafter the noted constant current is supplied through transistor 18 as controlled by resistance 10. Capacitor 12 charges exponentially.

Figure 2:
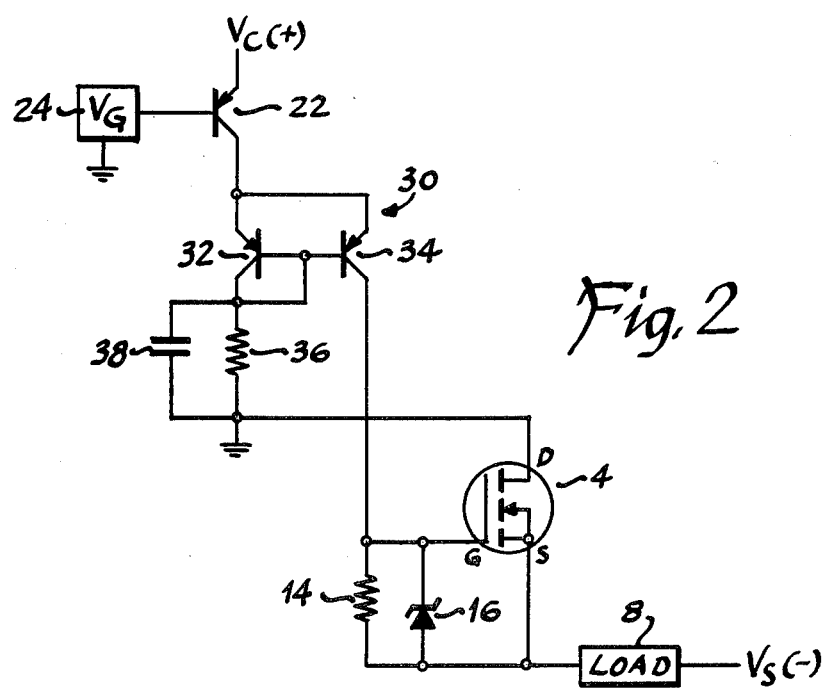
FIG. 2 is a circuit diagram showing an alternate embodiment of the circuit of FIG. 1.

FIG. 2 shows an alternate current source 30, and uses like reference numerals as FIG. 1 for the remaining components where appropriate to facilitate clarity. Current source 30 comprises a pair of PNP bipolar transistors 32 and 34 connected base to base with commonly supplied emitters from $V_c$. The collector of transistor 34 supplies current to resistor 14 to maintain requisite gate voltage for conduction of FET 4. The collector of transistor 32 is connected to the common bases and to control resistance means 36 which is grounded. This type of current source 30 is known, and is commonly called a current mirror. As is known, current through the right-hand transistor 34 mirrors current through the left-hand transistor 32 and is either equal thereto or is a given multiple thereof depending on designated resistance combinations in the emitter or collector circuits.

Bypass capacitor means 38 momentarily short circuits control resistor 36 at turn-on such that a momentarily higher current is supplied by current source 30 through transistor 34 to the gate of FET 4. This momentary higher current is supplied until capacitor 38 is charged, whereafter constant current is supplied through transistor 34.

In both FIGS. 1 and 2, opposite polarity transistors may of course be used.

It is recognized that various modifications are possible within the scope of the appended claims.

I claim:

1. A fast turn-on FET circuit having drain and source terminals and having a switch control terminal for receiving a control potential, comprising:
   an enhancement mode FET having a drain, source and gate, said drain and source being connected to respective said drain and source terminals;
   current source means including gate resistance means connected to said gate and said switch control terminal for biasing said FET into conduction, and including control resistance means for controlling the amount of constant current supplied; and
   bypass capacitor means connected in parallel with said control resistance means for momentarily short-circuiting the latter to transiently couple current thereacross at turn-on such that a momentarily higher current is supplied by said current source means to said FET gate.

2. The invention according to claim 1 wherein said current source means comprises a bipolar transistor having its base-emitter voltage set by a zener diode, and wherein said control resistance means is in the emitter circuit of said bipolar transistor, and wherein the collector of said bipolar transistor is connected to said FET gate, said constant current being supplied through the emitter-collector of said bipolar transistor, said bypass capacitor means being in parallel with said control resistance means and enabling momentarily higher current through said bipolar transistor at turn-on until said bypass capacitor means is charged, whereafter said constant current is supplied through said bipolar transistor.

3. The invention according to claim 1 wherein said current source means comprises a pair of bipolar transistors connected base to base with commonly supplied emitters, the collector of one said bipolar transistor supplying current for biasing said FET gate, and the collector of the other said bipolar transistor connected to said common bases and to said control resistance means, said bypass capacitor means being in parallel with said control resistance means and enabling momentarily higher current through said other bipolar transistor to said FET gate at turn-on until said bypass capacitor means is charged, whereafter constant current is supplied through said other bipolar transistor.

4. A fast turn-on FET circuit having drain and source terminals and having a switch control terminal for receiving a control potential, comprising:
 an enhancement mode FET having a drain, source and gate, said drain and source being connected to respective said drain and source terminals;
 zener regulated current source means including gate resistance means connected to said FET gate and said switch control terminal for biasing said FET into conduction, and including control resistance means for controlling the amount of constant current supplied; and
 bypass capacitor means connected in parallel with said control resistance means for momentarily short-circuiting the latter to transiently couple current thereacross at turn-on such that a momentarily higher current is supplied by said zener regulated current source means to said FET gate until said bypass capacitor means is charged, whereafter said constant current is supplied.

5. A fast turn-on FET circuit having drain and source terminals and having a switch control terminal for receiving a control potential, comprising:
 an enhancement mode FET having a drain, source and gate, said drain and source being connected to respective said drain and source terminals;
 current mirror source means including gate resistance means connected to said FET gate and said switch control terminal for biasing said FET into conduction, and including control resistance means for controlling the amount of constant current supplied; and
 bypass capacitor means connected in parallel with said control resistance means for momentarily short-circuiting the latter to transiently couple current thereacross at turn-on such that a momentarily higher current is supplied by said current mirror source means to said gate until said bypass capacitor means is charged, whereafter said constant current is supplied.

* * * * *